US005789759A

United States Patent [19]

Smith et al.

[11] Patent Number: 5,789,759

[45] Date of Patent: Aug. 4, 1998

[54] CATHODE STRUCTURE FOR REDUCED EMISSION AND ROBUST HANDLING PROPERTIES

[75] Inventors: Arlynn W. Smith, Blue Ridge; Warren David Vrescak, Roanoke, both of Va.

[73] Assignee: ITT Industries, Inc., White Plains, N.Y.

[21] Appl. No.: 754,762

[22] Filed: Nov. 21, 1996

[51] Int. Cl.[6] .............................. H01L 29/06; H01L 29/12

[52] U.S. Cl. .............................. 257/10; 257/11; 313/374; 313/366; 313/384

[58] Field of Search .............................. 257/11, 10; 313/374, 313/384, 366

[56] References Cited

U.S. PATENT DOCUMENTS

| | | | |
|---|---|---|---|
| 4,075,654 | 2/1978 | Hara et al. | 257/11 |
| 4,352,117 | 9/1982 | Cuomo et al. | 257/11 |
| 4,906,894 | 3/1990 | Miyawaki et al. | 313/542 |
| 4,961,025 | 10/1990 | Thomas et al. | 313/524 |
| 4,999,211 | 3/1991 | Duggan | 427/8 |
| 5,114,373 | 5/1992 | Peckman | 445/3 |
| 5,285,079 | 2/1994 | Tsukamoto et al. | 257/11 X |
| 5,298,831 | 3/1994 | Amith | 313/373 |
| 5,314,363 | 5/1994 | Murray | 445/14 |
| 5,360,630 | 11/1994 | Thomas et al. | 427/67 |
| 5,402,034 | 3/1995 | Blouch et al. | 313/370 |
| 5,404,025 | 4/1995 | Yamada | 257/10 |
| 5,557,167 | 9/1996 | Kim et al. | 257/11 X |

*Primary Examiner*—William Mintel
*Attorney, Agent, or Firm*—Plevy & Associates

[57] ABSTRACT

A photocathode device for use in an image intensifier, fabricated with a photoemissive semiconductor wafer having an active cathode layer which includes a central region of a first predetermined height surrounded by a peripheral region of a second predetermined height. The first predetermined height of the central region is configured to be greater than the second predetermined height of the peripheral region in order to create a recessed contact structure which is less likely to have unwanted emission points. A layer of conductive material covers the peripheral region to provide an electrical contact to the photocathode device. A layer of insulating material covers the layer of conductive material in order to protect the contact layer from being damage during handling operations.

8 Claims, 2 Drawing Sheets

CATHODE STRUCTURE FOR REDUCED EMISSION AND ROBUST HANDLING PROPERTIES

FIELD OF THE INVENTION

The present invention relates generally to cathode devices and more particularly to a photocathode device having a recessed contact layer which is covered with an insulating material that substantially reduces undesirable emission points and enables the contact layer to withstand substantially more abuse during handling operations.

BACKGROUND OF THE INVENTION

Photocathode devices are optoelectronic detectors which use the photoemissive effect to detect light energy. Thus, when photons impinge the surface of a photocathode device, the impinging photons cause electrons to be emitted therefrom. Many photocathode devices are made from semiconductor materials such as gallium arsenide (GaAs) which exhibit the photoemissive effect. While GaAs is preferred, it is noted that other III–V materials can be used such as GaP, GaInAsP, InAsP and so on. In a semiconductor photocathode device, photons are absorbed by a photoemissive semiconductor material. The absorbed photons cause the carrier density of the semiconductor material to increase, thereby causing the material to generate a photocurrent.

Semiconductor photocathode structures are employed in the image intensifiers of state of the art night vision devices. These photocathode structures typically use a semiconductor epilayer for the photon absorbing material. The semiconductor epilayer is thermally and mechanically bonded to a glass faceplate of the image intensifier to provide a rigid, vacuum supporting tube structure. The peripheral surface of both the semiconductor epilayer and the glass faceplate are coated with a conducting material, such as chrome, to provide an electrical contact to the photocathode semiconductor structure. Typically in such photocathode structures, the common cathode material is p-type GaAs. However, the chrome contact layer forms a poor ohmic contact at the low p-type doping concentrations of the GaAs common cathode material. In any case, the chrome contact layer is usually deposited prior to the cathode structure being placed in a final etch solution which is used to prepare the cathode for entry into an ultra-high vacuum station. Consequently, the final etch process removes only the uppermost layer of the semiconducting material using the chrome contact layer as an etch mask.

The thickness of the epilayer causes a large discontinuity in height between the epilayer and the faceplate which the conductive contact layer must be contoured to. Covering such a large vertical step with a thin layer of material often leads to gaps in the coverage of the material resulting in an incomplete contact which causes substantially higher operating voltages. Also contributing to substantially higher operating voltages is the poor ohmic contact quality provided by using a chrome contact layer with a low concentration p-type doped GaAs common cathode material. Moreover, the thin contact layer is easily damaged by physical and mechanical handling operations which leads to peeling of the conductive layer. When a high voltage is applied between the cathode and the input of a microchannel plate of an image intensifier, the peeling layer leads to undesirable emission points. Since the conductive layer is closer to the microchannel plate input than the emission surface of the photocathode, any contaminates on the conductive layer can lead to further undesirable emission points.

Accordingly, there is a need for a semiconductor photocathode structure that substantially overcomes the problem of undesirable emission points and excessive fragility during handling operations.

SUMMARY OF THE INVENTION

A cathode device for use in an image intensifier, comprising a photoemissive semiconductor wafer having an active cathode layer which defines a recessed contact surface, and a layer of conductive material covering the contact surface for providing an electrical contact to the cathode device. In one embodiment of the invention, the layer of conductive material is covered with a protective layer of insulating material.

Also described is a method for fabricating the above described cathode device. The method includes the steps of providing a photoemissive semiconductor wafer having an active cathode layer, masking off the wafer so that a peripheral region of the wafer is exposed, etching the exposed peripheral region of the wafer for a predetermined time period to partially remove a peripheral region of the active cathode layer; and depositing a layer of conducting material over a remaining peripheral region of the active cathode layer to provide an electrical contact to the device.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

Although the photocathode device of the present invention can be used in many different applications where optoelectronic detectors are required, the present invention is especially useful in image intensifiers found in state of the art night vision devices. Accordingly, the present invention will be described in conjunction with its use in an image intensifier of a night vision device.

Figure 1:
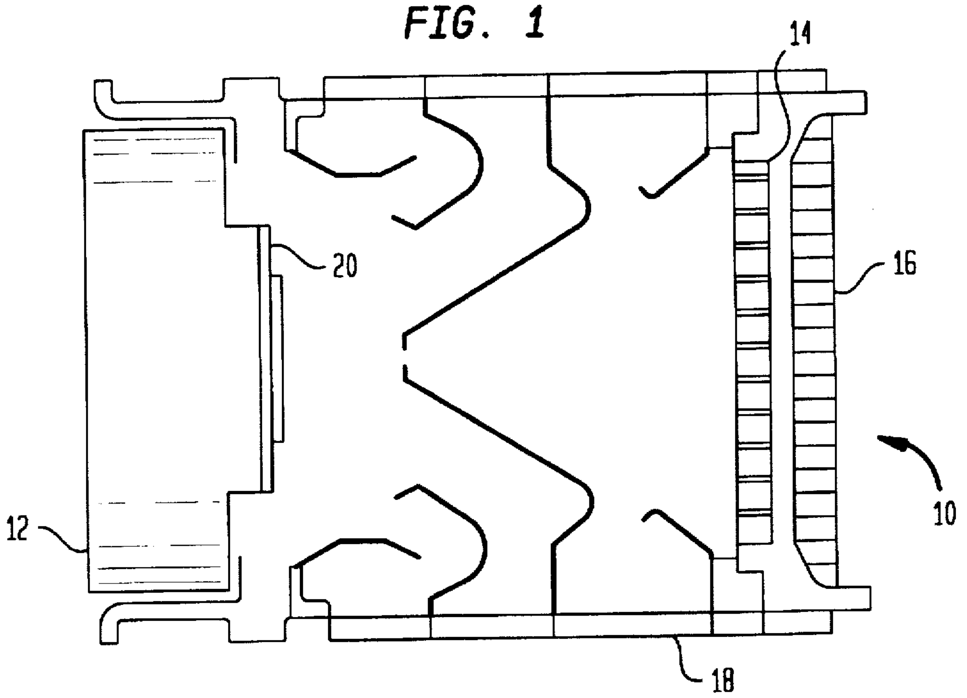
FIG. 1 is a cross-sectional side view through an image intensifier which employs the photocathode device of the present invention.

Referring to FIG. 1, there is shown an image intensifier 10 of a night vision device (not shown). The image intensifier 10 includes a photocathode 20 made in accordance with the present invention. The photocathode 20 is bonded to a faceplate 12 which is one of three essential components of the image intensifier 10. The other two components of the image intensifier 10 are an electron amplifier 14 such as a microchannel plate (MCP), and a phosphor screen 16 (anode). The faceplate 12 is generally designed to minimize light scatter and stray light in the image intensifier 10 as discussed in U.S. Pat. No. 4,961,025 entitled CATHODE FOR IMAGE INTENSIFIER TUBE HAVING REDUCED VEILING GLARE issued on Oct. 2, 1990 to Thomas et al. and assigned to ITT Corporation, the assignee herein. The faceplate 12 with the photocathode 20 bonded thereto, the MCP 14 and the phosphor screen 16 are assembled to an evacuated housing 18 using techniques such as those described in U.S. Pat. No. 4,999,211 entitled APPARATUS AND METHOD FOR MAKING A PHOTOCATHODE issued on Mar. 12, 1991 to Duggan, and U.S. Pat. No. 5,314,363 entitled AUTOMATED SYSTEM AND METHOD FOR ASSEMBLING IMAGE INTENSIFIER TUBES issued on May 24, 1994 to Murray, both of which are assigned to ITT Corporation, the assignee herein.

The photocathode 20 of the present invention substantially overcomes the problems of unwanted emission points from the contact and contact fragileness which plague present photocathode structures, by recessing and covering the contact layer with a compatible insulating material. Recessing the contact of the photocathode operates to move the high field region away from the input of the microchannel plate and also reduces the height of the step which must be covered with conductive material. Depositing a layer of insulator material over the conductive material of the contact will substantially reduce the possible charging of particles on the conductive layer thereby reducing undesirable emission points. Further, insulator materials are generally more rugged than metals, accordingly, the insulator layer covering the contact layer in the present invention will be substantially more capable of withstanding the abuse of subsequent handling operations. Moreover, the low p-type doped GaAs common cathode material which is directly under the contact may be more heavily doped by ion implantation thus, substantially reducing the contact potential resulting in lower operating voltages.

Figure 2A:
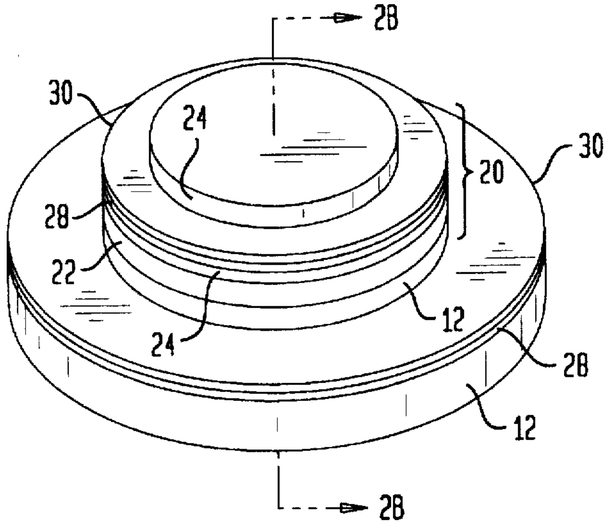
FIG. 2A is a perspective view of the photocathode device of the present invention.
Figure 2B:
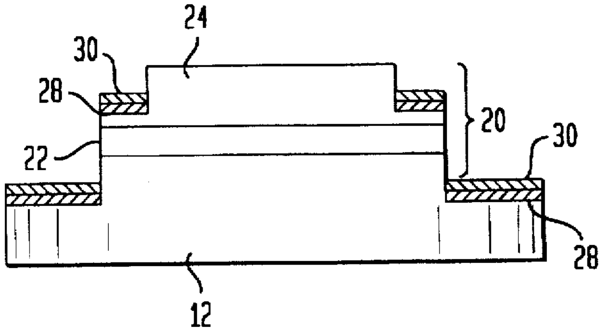
FIG. 2B is a cross-sectional side view through line 2B—2B in FIG. 2A.

Referring collectively to FIGS. 2A and 2B, there is shown a photocathode 20 made in accordance with the present invention. As described above, the photocathode 20 thermally and mechanically bonded to the faceplate 12 which has a stepped configuration and is made from a high quality optical material such as glass. One such optical glass is manufactured by Corning under part number 7056. This glass comprises 70 percent silica ($SiO_2$), 17 percent boric oxide ($B_2O_3$), 8 percent potash ($K_2O$), 3 percent alumina ($Al_2O_3$), and 1 percent soda ($Na_2O$) and lithium oxide ($Li_2O$). It should be understood, that other glasses may be used.

Still referring to FIGS. 2A and 2B, the photocathode 20 comprises a photoemissive wafer which includes an aluminum gallium arsenide (AlGaAs) window layer 22 that is bonded directly to a centrally extending portion of the stepped faceplate 12. The window layer 22 is followed by a stepped gallium arsenide (GaAs) active or cathode layer 24. The annular peripheral surfaces surrounding the centrally extending portions of the faceplate 12 and the stepped GaAs cathode layer 24 of the photocathode 20, are coated with a layer 28 of conducting material such as chrome, to provide a an electrical contact to the photocathode 20. The layer 28 of conducting material is covered by a layer 30 of insulating material.

Figure 3A:
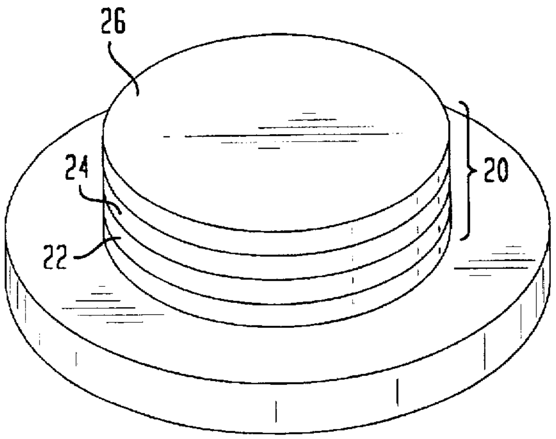
FIGS. 3A–3E depict the fabrication of the photocathode device of FIG. 2A.
Figure 3B:
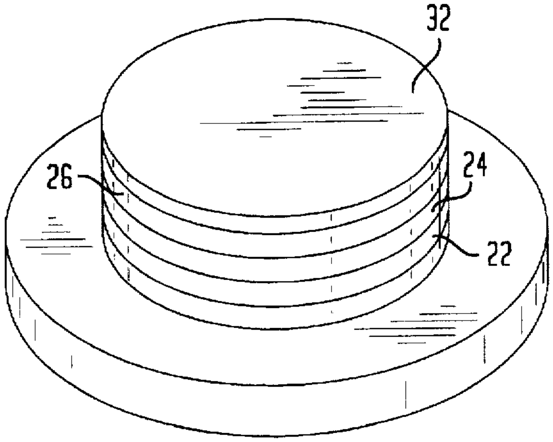

Referring to FIGS. 3A–3E, the steps taken to construct the photocathode 20 of the present invention are depicted. In FIG. 3A, the photocathode 20 is bonded to the faceplate 12 using well known techniques such as those taught in U.S. Pat. No. 5,298,831 entitled METHOD OF MAKING PHOTOCATHODES FOR IMAGE INTENSIFIER TUBES issued on Mar. 29, 1994 to Amith and assigned to ITT Corporation, the assignee herein. The pertinent sections of the U.S. Pat. No. 5,298,831 dealing with the bonding of a photocathode to a faceplate of an image intensifier are incorporated herein by reference.

Figure 3C:
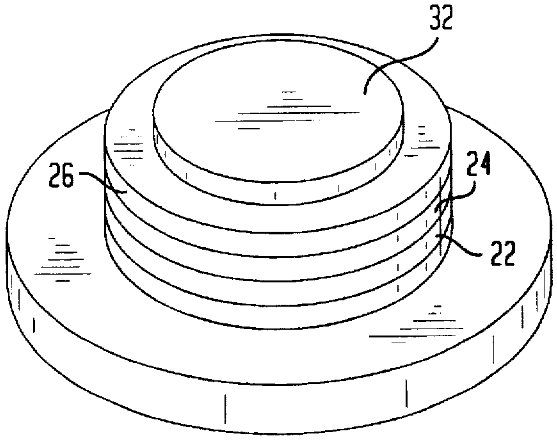
Figure 3D:
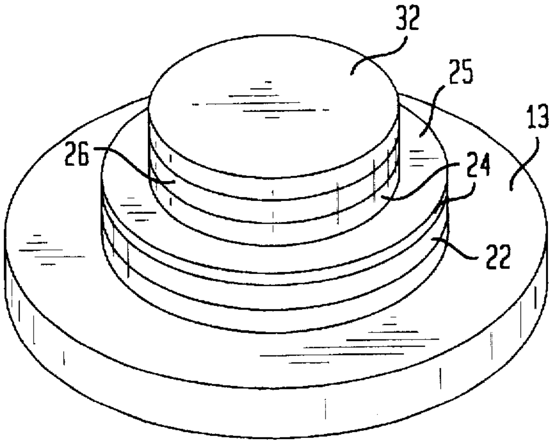

As can be seen in FIG. 3A, the photocathode structure 20 is configured conventionally at this stage of fabrication with a AlGaAs stop layer 26 and the GaAs active layer 24 completely covering the entire AlGaAs window layer 22. As mentioned above, the bulk doping of the photocathode 20 is generally very low, for example, the AlGaAs window layer 22 and the GaAs active layer 24 utilize a low doping concentration of between $1\times10^{17}$ $cm^{-3}$ and $5\times10^{17}$ $cm^{-3}$ In FIG. 3B, a layer 32 of resist is deposited over the AlGaAs stop layer 26. The resist layer 32 is subsequently patterned into a small circular mask as shown in FIG. 3C, using conventional lithography techniques. The patterned resist layer 32 is developed and the exposed peripheries of the AlGaAs stop layer 26 and the GaAs active layer 24 are removed using a conventional etching process as shown in FIG. 3D. The etching process is timed so that the periphery of the GaAs active layer 24 is only partially removed to provide a stepped configuration which defines an annular peripheral surface 25 in the active layer 24. At this stage in the fabrication, ion implantation is performed to heavily dope the remaining peripheral region defined under the annular peripheral surface 25 of the active layer 24. This peripheral region will form the contact of the photocathode. The recessed structure of the contact enables it to be more heavily doped than in prior art photocathodes since recessing moves the high field region away from the input of the microchannel plate when the photocathode of the present invention is assembled in an image intensifier. Accordingly, the more heavily doped contact of the photocathode 20 of the present invention provides a substantially reduced contact potential which results in lower operating voltages.

Figure 3E:
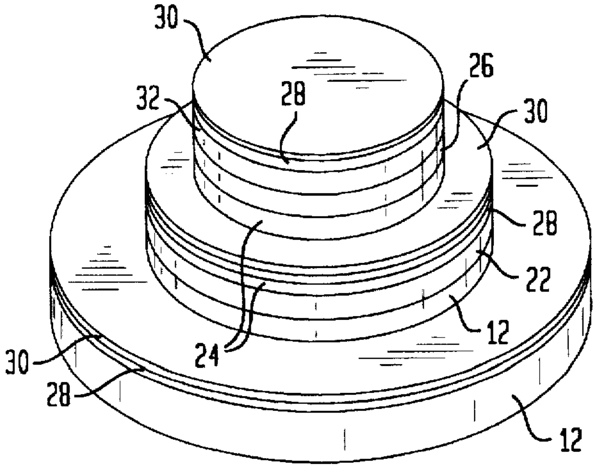

In FIG. 3E, a contact layer 28 of conductive material is deposited over the patterned resist layer 32, the annular peripheral surface 25 of the active layer 24 and an annular peripheral surface 13 of the faceplate 12. The contact layer 28 preferably comprises a layer of chrome which is deposited by conventional sputtering or evaporation techniques. The contact layer 28 covering the resist layer 32, the annular peripheral surface 25 of the active layer 24 and the annular peripheral surface 13 of the faceplate 12 is then covered by a protective layer 30 of insulating material. The insulating material used for the protective layer 30 must be a material that is compatible with the contact layer 28 such as silicon dioxide. The protective layer 30 of insulating material is deposited by evaporation or any other well known technique.

The final photocathode structure of FIGS. 2A and 2B is achieved by first removing the patterned resist layer 32 and the portions of the contact layer 28 and protective layer 30 which cover the patterned resist layer 32. Then, the AlGaAs etch stop layer 26 is removed and a final surface etch is performed.

It will be understood that the embodiment described herein is merely exemplary and that a person skilled in the art may make many variations and modifications to the described embodiment utilizing functionally equivalent elements to those described. Any variations or modifications to the invention described hereinabove are intended to be included within the scope of the invention as defined by the appended claims.

What is claimed is:

1. A cathode device for use in an image intensifier, comprising:

a photoemissive semiconductor wafer having an active cathode layer which defines a recessed contact surface;

a layer of conductive material covering said contact surface for providing an electrical contact to said cathode device; and, a layer of insulating material covering said layer of conductive material.

2. The cathode device according to claim 1, wherein said recessed contact surface overlies a region of said active cathode layer which is heavily doped relative to remaining regions of said active cathode layer.

3. The cathode device according to claim 1, wherein said photoemissive semiconductor wafer includes a window layer disposed adjacent to said active cathode layer.

4. The cathode device according to claim 1, further comprising a faceplate, said photoemissive wafer being bonded to said faceplate.

5. A photocathode device for use in an image intensifier, comprising:

a photoemissive semiconductor wafer having an active cathode layer which includes a central region of a first predetermined height surrounded by a peripheral region of a second predetermined height, said first predetermined height of said central region being greater than said second predetermined height of said peripheral region;

a layer of conductive material covering said peripheral region to provide an electrical contact to said photocathode device; and, a layer of insulating material covering said layer of conductive material.

6. The photocathode device according to claim 5, wherein said peripheral region is heavily doped relative to said central region of said active cathode layer.

7. The photocathode device according to claim 5, wherein said photoemissive semiconductor wafer includes a window layer disposed adjacent to said active cathode layer.

8. The photocathode device according to claim 5, further comprising a faceplate fabricated from an optically transparent material, said photoemissive wafer bonded to said faceplate.

* * * * *